US010734998B1

(12) United States Patent
Cabanas-Holmen et al.

(10) Patent No.: US 10,734,998 B1
(45) Date of Patent: Aug. 4, 2020

(54) COMPLEMENTARY SELF-LIMITING LOGIC

(71) Applicant: The Boeing Company, Chicago, IL (US)

(72) Inventors: Manuel Cabanas-Holmen, Roy, WA (US); Jeff Maharrey, Mountlake Terrace, WA (US); Salim Rabaa, Lake Forest Park, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/428,697

(22) Filed: May 31, 2019

(51) Int. Cl.
*H03K 19/20* (2006.01)
*H03K 19/00* (2006.01)
*H03K 19/003* (2006.01)
*H03K 19/007* (2006.01)
*H03K 17/16* (2006.01)

(52) U.S. Cl.
CPC ..... *H03K 19/00315* (2013.01); *H03K 17/163* (2013.01); *H03K 19/007* (2013.01); *H03K 19/0033* (2013.01); *H03K 19/20* (2013.01); *H03K 19/00338* (2013.01); *H03K 19/00361* (2013.01)

(58) Field of Classification Search
CPC ............. H03K 19/00338; H03K 19/20; H03K 19/0033; H03K 19/007; H03K 3/013; H03K 3/0375; H03K 19/00315; H03K 19/00361
See application file for complete search history.

(56) References Cited

U.S. PATENT DOCUMENTS

| | | | | |
|---|---|---|---|---|
| 6,058,041 A | * | 5/2000 | Golke | G11C 5/005 365/154 |
| 6,278,287 B1 | * | 8/2001 | Baze | G11C 11/4125 257/369 |
| 6,417,710 B1 | * | 7/2002 | Bartholet | H03K 3/0375 326/11 |
| 6,667,520 B1 | * | 12/2003 | Fulkerson | G11C 5/005 257/369 |
| 6,794,908 B2 | * | 9/2004 | Erstad | H01L 27/1203 257/E27.112 |
| 7,298,010 B1 | * | 11/2007 | Ma | H01L 23/556 257/357 |

(Continued)

OTHER PUBLICATIONS

Rathod et al., "Rad-Hard 32 nm FinFET Based Inverters", Electronic and Computer Engineering Department Indian Institute of Technology Roorkee, India-247667, 2009.

*Primary Examiner* — Vibol Tan
(74) *Attorney, Agent, or Firm* — Haynes and Boone LLP

(57) ABSTRACT

Systems, methods, and apparatus for complementary self-limiting logic are disclosed. In one or more embodiments, a method for mitigating errors caused by transients in a logic gate transistor comprises biasing, by a first stage of transistors, a second stage of transistors such that a voltage potential across terminals of each of the transistors of the second stage are at an equal voltage potential. The method further comprises biasing, by the second stage of transistors, the logic gate transistor such that a voltage potential across terminals of the logic gate transistor are at an equal voltage potential, thereby ensuring that the transients will not cause the logic gate transistor to erroneously change logic states when the logic gate transistor is in a logically off state.

20 Claims, 3 Drawing Sheets

(56) References Cited

U.S. PATENT DOCUMENTS

| | | | | |
|---|---|---|---|---|
| 7,423,448 B2* | 9/2008 | Von Thun | ........ | H03K 19/00338 |
| | | | | 326/10 |
| 7,429,797 B2* | 9/2008 | Coenen | ............. | H01L 23/49838 |
| | | | | 257/691 |
| 7,830,203 B2* | 11/2010 | Chang | .................. | H03K 17/163 |
| | | | | 327/534 |
| 8,207,753 B2* | 6/2012 | Cabanas-Holmen | ........................ | |
| | | | | G11C 5/005 |
| | | | | 326/13 |
| 8,847,621 B2* | 9/2014 | Cannon | ............ | H03K 19/00338 |
| | | | | 326/13 |
| 9,191,009 B1* | 11/2015 | Clark | ...................... | H03K 19/23 |
| 9,294,092 B2* | 3/2016 | Hutton | ............... | H03K 19/0033 |
| 9,748,955 B1* | 8/2017 | Gasiot | ................. | H01L 27/0266 |
| 10,348,302 B1* | 7/2019 | Ross | ................. | H03K 19/0033 |

* cited by examiner

COMPLEMENTARY SELF-LIMITING LOGIC

FIELD

The present disclosure relates to logic devices. In particular, the present disclosure relates to complementary self-limiting logic gates for logic devices.

BACKGROUND

Radiation events can cause spurious signals (i.e. transients) to be generated in logic gates that can in turn cause system-level malfunctions in high performance System-on-a-Chip (SoC) devices. As technologies scale down to tens of nanometers, it has become increasingly difficult to design transient-mitigated logic gates with minimal performance and power penalties. Of particular interest is the design of transient-mitigated logic gates for high fanout nets (e.g., clock and reset distribution networks) in high performance SoCs fabricated in modern bulk Fin Field Effect Transistor (FinFET) technologies (e.g., GlobalFoundries 14LPP bulk FinFET technology).

There are no known logic gate designs that fully mitigate for transients in modern bulk FinFET technologies with minimal power and performance penalties. Temporal filtering techniques may be used in addition to traditional logic gates to mitigate transients. However, the main drawback to filtering, especially on high-fanout high-activity nets, such as a clock, is the enormous increase in power consumption. Additionally, filtering consumes significantly more area in advanced technologies due to the fact that the logic gates with which the filters are built have reduced propagation delays, thereby resulting in more logic gates per filter. Filtering, or any temporal based mitigation technique, additionally requires extensive and costly characterization of each technology in order to determine how much filtering is needed.

In light of the foregoing, there is a need for an improved design for transient-mitigated logic gates to reduce SoC error rates to acceptable levels.

SUMMARY

The present disclosure relates to a method, system, and apparatus for complementary self-limiting logic. In one or more embodiments, a method for mitigating errors caused by transients in a logic gate transistor comprises biasing, by a first stage of transistors, a second stage of transistors such that a voltage potential across terminals of each of the transistors of the second stage are at an equal voltage potential. The method further comprises biasing, by the second stage of transistors, the logic gate transistor such that a voltage potential across terminals of the logic gate transistor are at an equal voltage potential, thereby ensuring that the transients will not cause the logic gate transistor to erroneously change logic states when the logic gate transistor is in a logically off state.

In one or more embodiments, the transients are due to a radiation event, a noise event, or crosstalk. In at least one embodiment, the logic gate transistor is a field-effect transistor (FET). In some embodiments, the FET is one of a metal-oxide-semiconductor field-effect transistor (MOSFET) or a junction field-effect transistor (JFET).

In at least one embodiment, the logic gate transistor is a p-type transistor or an n-type transistor. In one or more embodiments, the terminals of the logic gate transistor are a source terminal and a drain terminal.

In one or more embodiments, the transistors of the first stage of transistors comprise a p-type transistor and an n-type transistor. In at least one embodiment, the transistors of the second stage of transistors comprise a p-type transistor and an n-type transistor.

In at least one embodiment, a system-on-a chip (SoC) device comprises the logic gate transistor, the first stage of transistors, and the second stage of transistors.

In one or more embodiments, a logic device comprises the logic gate transistor. In some embodiments, the logic device is an inverter, an OR gate, a NOR gate, an AND gate, a NAND gate, a NOT gate, a XOR gate, or a XNOR gate.

In at least one embodiment, a system for mitigating errors caused by transients in a logic gate transistor comprises the logic gate transistor. The system further comprises a first stage of transistors to bias a second stage of transistors such that a voltage potential across terminals of each of the transistors of the second stage are at an equal voltage potential. Further, the system comprises the second stage of transistors to bias the logic gate transistor such that a voltage potential across terminals of the logic gate transistor are at an equal voltage potential, thereby ensuring that the transients will not cause the logic gate transistor to erroneously change logic states when the logic gate transistor is in a logically off state.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

DESCRIPTION

Figure 1:
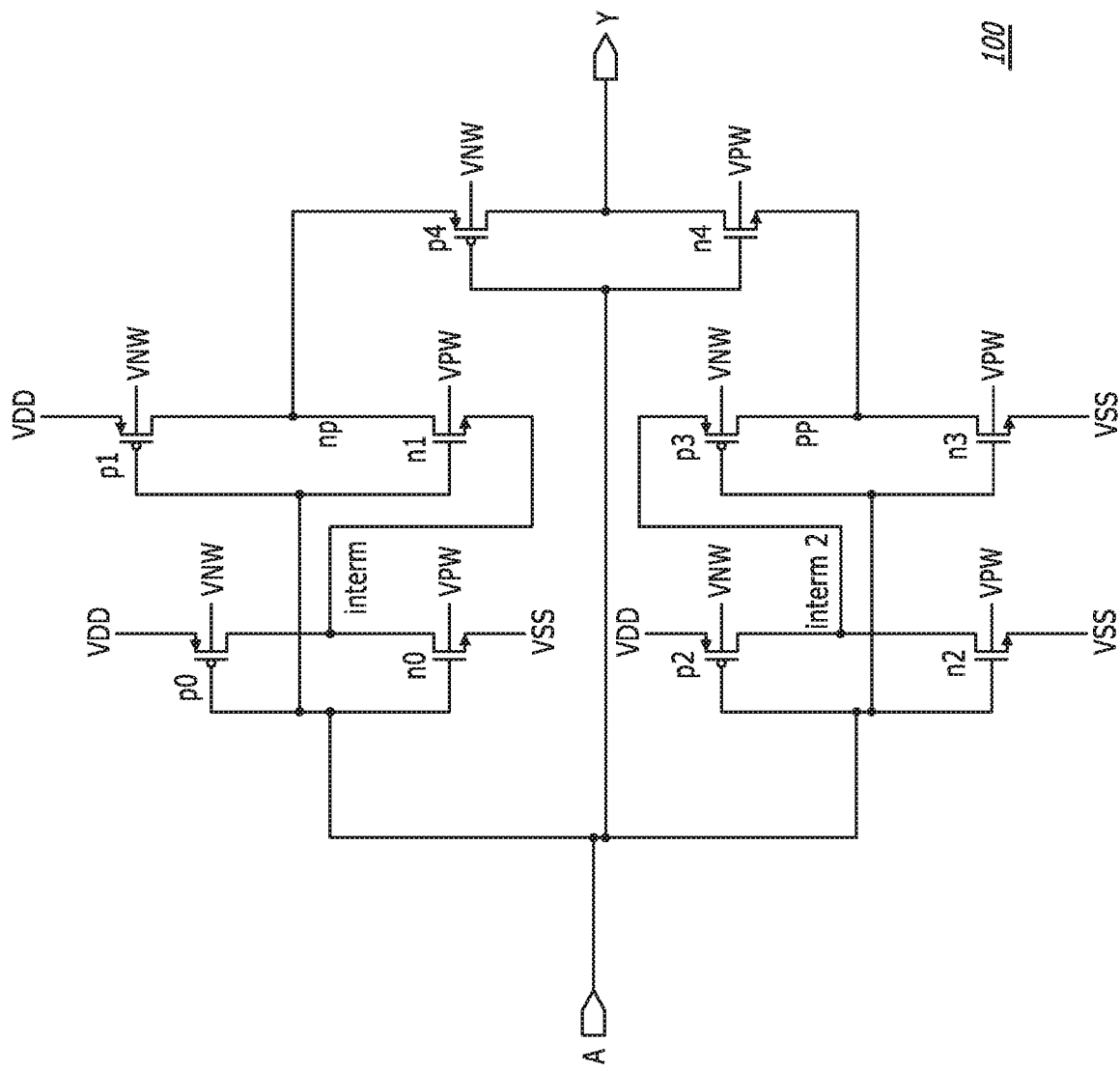
FIG. 1 is a diagram showing an exemplary logic device incorporating the disclosed complementary self-limiting logic gate design, in accordance with at least one embodiment of the present disclosure.

The methods and apparatus disclosed herein provide an operative system for complementary self-limiting logic gates for logic devices. In one or more embodiments, the system of the present disclosure provides a complementary self-limiting logic gate design that mitigates errors due to radiation and crosstalk induced transients with minimal performance and power penalties. The disclosed complementary self-limiting logic gate design reduces the disturbance of nodal charge during a radiation or noise event by eliminating transistor conduction during the event. Transistor conduction is eliminated during these events by bringing the source and drain terminals to an equal potential when the transistor is in an "OFF" state. The transient mitigation enhancements of the disclosed design result in a very small increase in propagation delay compared to commercial cells.

As previously mentioned above, radiation events can cause spurious signals (i.e. transients) to be generated in logic gates that can in turn cause system-level malfunctions in high performance System-on-a-Chip (SoC) devices. As technologies scale down to tens of nanometers, it has become increasingly difficult to design transient-mitigated logic gates with minimal performance and power penalties. Of particular interest is the design of transient-mitigated logic gates for high fanout nets (e.g., clock and reset distribution networks) in high performance SoCs fabricated in modern bulk Fin Field Effect Transistor (FinFET) technologies (e.g., GlobalFoundries 14LPP bulk FinFET technology).

There are no known logic gate designs that fully mitigate for transients in modern bulk FinFET technologies with minimal power and performance penalties. Temporal filtering techniques may be used in addition to traditional logic gates to mitigate transients. However, the main drawback to filtering, especially on high-fanout high-activity nets, such as a clock, is the enormous increase in power consumption. Additionally, filtering consumes significantly more area in advanced technologies due to the fact that the logic gates with which the filters are built have reduced propagation delays, thereby resulting in more logic gates per filter. Filtering, or any temporal based mitigation technique, additionally requires extensive and costly characterization of each technology in order to determine how much filtering is needed.

The system of the present disclosure provides a complementary self-limiting logic gate design that mitigates errors due to radiation and crosstalk induced transients with minimal performance and power penalties. The main feature of the disclosed complementary self-limiting logic gate design is the novel circuit topology that limits the generation and sustainment of radiation or crosstalk induced transients.

Conventionally, in logic gate designs, every logic gate inherently has transistors that are in an "ON" state, which are actively providing the needed logic state, and transistors that are in an "OFF" state, which are waiting to change the logic state when needed. In a typical conventional logic gate, an "OFF" transistor (e.g., a field effect transistor (FET) in an "OFF" state) has voltage potential between its source and drain terminals equal in magnitude to the supply voltage. A radiation event can cause the drain terminal to lose its logic value (i.e. erroneously cause the transistor to change from the "OFF" state to an "ON" state) by triggering the "OFF" transistor to either charge or discharge the drain potential to the source potential.

In the disclosed complementary self-limiting logic gate design, the "OFF" transistors are put in a low conduction state by bringing the source and drain terminals to equal potential. In this case, a radiation event cannot cause the "OFF" transistor to change its logic state (i.e. cannot erroneously cause the transistor to change from the "OFF" state to an "ON" state) because the source and drain are already at the same potential or logic value.

The disclosed complementary self-limiting logic gates can be implemented in any integrated circuit technology, including but not limited to, planar bulk and Silicon-on-Insulator (SOI) complementary metal-oxide-semiconductor (CMOS) and Fin Field Effect Transistor (FinFET) technologies. In addition, the disclosed complementary self-limiting logic gate design enables the design of low power, high performance radiation hardened integrated circuits (ICs) in modern technologies, which allows for the design of higher performance systems.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to logic gates and devices, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

FIG. 1 is a diagram showing an exemplary logic device 100 incorporating the disclosed complementary self-limiting logic gate design, in accordance with at least one embodiment of the present disclosure. In this figure, the logic device 100 is shown to comprise a plurality of transistors (i.e. p0, n0, p1, n1, p2, n2, p3, n3, p4, n4). The transistors are either p-type transistors (e.g., p0, p1, p2, p3, p4), or n-type transistors (e.g., n0, n1, n2, n3, n4). The transistors (i.e. p0, n0, p1, n1, p2, n2, p3, n3, p4, n4) in the logic device 100 are field-effect transistors (FETs). Various different types of FETs may be employed for the transistors (i.e. p0, n0, p1, n1, p2, n2, p3, n3, p4, n4) of the logic device 100 including, but not limited to, metal-oxide semiconductor field-effect transistors (MOSFETs) and junction field-effect transistors (JFETs).

In particular, the logic device 100 depicted in FIG. 1 is an inverter. However, it should be noted that the disclosed complementary self-limiting logic gate design may be incorporated into various different types of logic devices other than an inverter including, but not limited to, an OR gate, a NOR gate, an AND gate, a NAND gate, a NOT gate, a XOR gate, and a XNOR gate.

In this figure, the logic device 100 comprises an upper portion and a lower portion. Each portion (i.e. upper portion and lower portion) of the logic device 100 comprises a first stage of transistors. The first stage of transistors for the upper portion comprises transistors p0 and n0. And, the first stage of transistors for the lower portion comprises transistors p2 and n2.

Also, each portion (i.e. upper portion and lower portion) of the logic device 100 comprises a second stage of transistors. The second stage of transistors for the upper portion comprises transistors p1 and n1. And, the second stage of transistors for the lower portion comprises transistors p3 and n3.

In addition, each portion (i.e. upper portion and lower portion) of the logic device 100 comprises a logic gate transistor. The logic gate transistor for the upper portion is transistor p4, and the logic gate transistor for the lower portion is transistor n4.

During operation of the logic device 100, for the upper portion, the first stage of transistors (i.e. transistors p0 and n0) biases (via the intern connection) the second stage of transistors (i.e. transistors p1 and n1) such that a voltage potential across the source and drain terminals of the transistors of the second stage (i.e. transistors p1 and n1) are at an equal voltage potential (i.e. the source and drain terminals of transistor p1 are at the same voltage potential, and the source and drain terminals of transistor n1 are at the same voltage potential).

Also during operation of the logic device 100, for the upper portion, the second stage of transistors (i.e. transistors p1 and n1) biases (via their connection to transistor p4) the logic gate transistor (i.e. transistor p4) such that a voltage potential across terminals of the logic gate transistor (i.e. transistor p4) are at an equal voltage potential, thereby ensuring that transients (e.g., caused by radiation and/or noise events and/or crosstalk) will not cause the logic gate transistor (i.e. transistor p4) to erroneously change logic states when the logic gate transistor (i.e. transistor p4) in an a logically "OFF" state.

It should be noted that when the source and drain terminals of a transistor (e.g., transistor p1, n1, or p4) are at the same voltage potential when the transistor is in an "OFF" state, a radiation event, a noise event, and/or crosstalk will not cause the transistor to change the logic stage (i.e. will not cause the transistor to erroneously change the logic state from "OFF" to "ON") because the source and drain terminals are already at the same potential or logic value.

During operation of the logic device 100, for the lower portion, the first stage of transistors (i.e. transistors p2 and n2) biases (via the interm2 connection) the second stage of transistors (i.e. transistors p3 and n3) such that a voltage potential across the source and drain terminals of the transistors of the second stage (i.e. transistors p3 and n3) are at an equal voltage potential (i.e. the source and drain terminals of transistor p3 are at the same voltage potential, and the source and drain terminals of transistor n3 are at the same voltage potential).

Also during operation of the logic device 100, for the lower portion, the second stage of transistors (i.e. transistors p3 and n3) biases (via their connection to transistor n4) the logic gate transistor (i.e. transistor n4) such that a voltage potential across terminals of the logic gate transistor (i.e. transistor n4) are at an equal voltage potential, thereby ensuring that transients (e.g., caused by radiation and/or noise events and/or crosstalk) will not cause the logic gate transistor (i.e. transistor n4) to erroneously change logic states when the logic gate transistor (i.e. transistor n4) in an a logically "OFF" state.

It should be noted that when the source and drain terminals of a transistor (e.g., transistor p3, n3, or n4) are at the same voltage potential when the transistor is in an "OFF" state, a radiation event, a noise event, and/or crosstalk will not cause the transistor to change the logic stage (i.e. will not cause the transistor to erroneously change the logic state from "OFF" to "ON") because the source and drain terminals are already at the same potential or logic value.

In addition, for the disclosed complementary self-limiting logic gate design, it should be noted that the upper portion of the logic device 100 of FIG. 1 shows the specific design (which comprises a first stage of transistors p0, n0 and a second stage of transistors p1, n1) for ensuring that transients do not erroneously change a p-type transistor (i.e. transistor p4) from an "OFF" stage to an "ON" state. And, the lower portion of the logic device 100 of FIG. 1 shows the specific design (which comprises a first stage of transistors p2, n2 and a second stage of transistors p3, n3) for ensuring that transients do not erroneously change an n-type transistor (i.e. transistor n4) from an "OFF" stage to an "ON" state.

Figure 2:
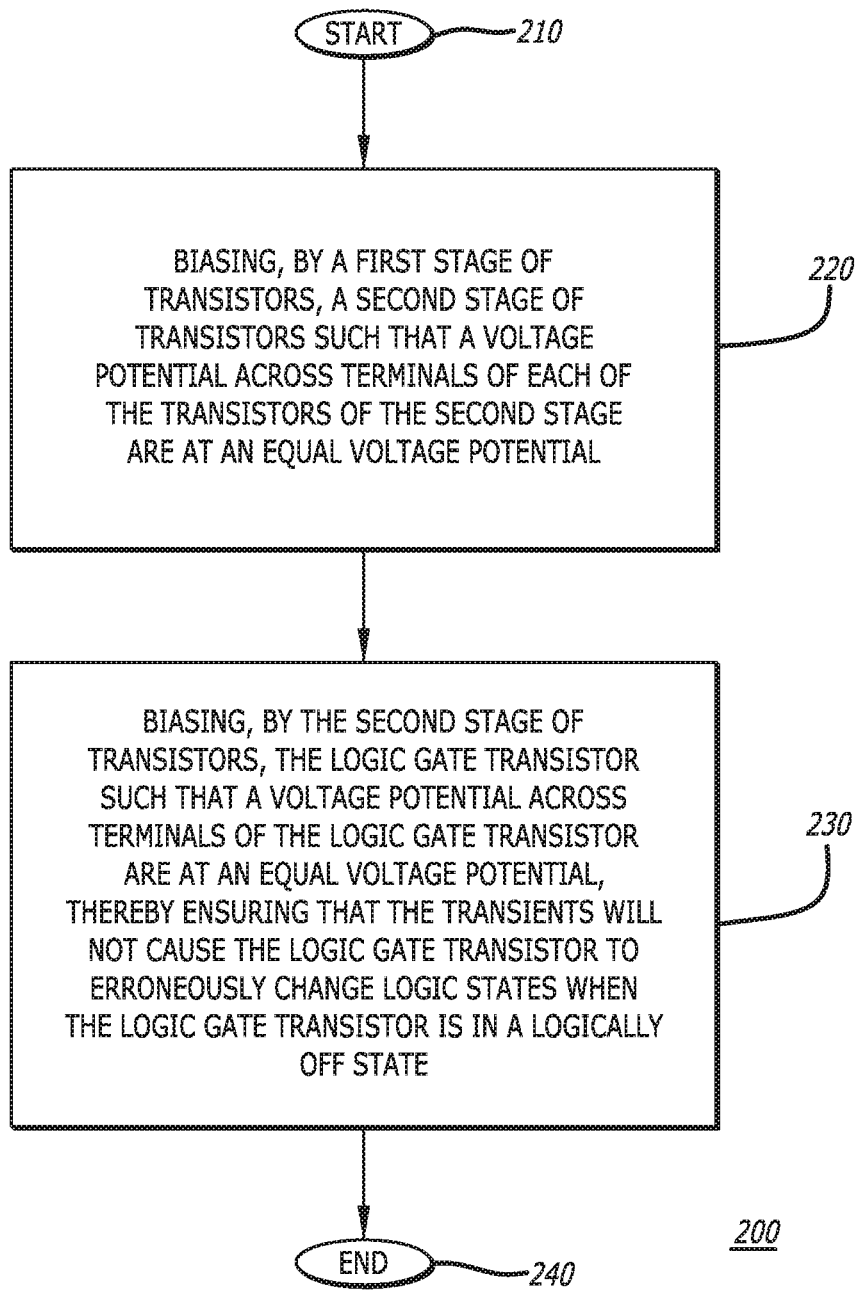
FIG. 2 is a flow chart showing the disclosed method for operation of the disclosed complementary self-limiting logic gate design, in accordance with at least one embodiment of the present disclosure.

FIG. 2 is a flow chart showing the disclosed method 200 for operation of the disclosed complementary self-limiting logic gate design, in accordance with at least one embodiment of the present disclosure. At the start of the method 200 for mitigating errors caused by transients in a logic gate transistor, a first stage of transistors biases a second stage of transistors such that a voltage potential across terminals of each of the transistors of the second stage are at an equal voltage potential 220. Then, the second stage of transistors biases the logic gate transistor such that a voltage potential across terminals of the logic gate transistor are at an equal voltage potential, thereby ensuring that the transients will not cause the logic gate transistor to erroneously change logic states when the logic gate transistor is in a logically off state 230. Then, the method 200 ends 240.

Figure 3:
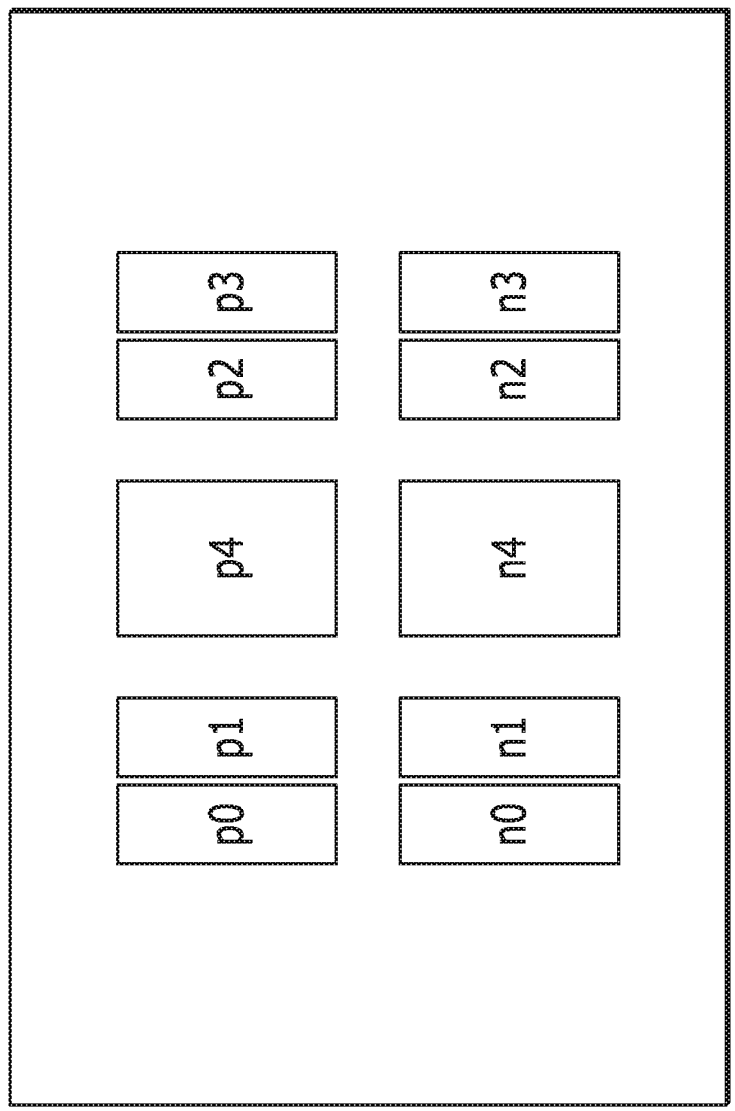
FIG. 3 is a diagram showing an exemplary integrated circuit (IC) layout for the exemplary logic device of FIG. 1, in accordance with at least one embodiment of the present disclosure.

FIG. 3 is a diagram showing an exemplary integrated circuit (IC) layout for the exemplary logic device of FIG. 1, in accordance with at least one embodiment of the present disclosure. In particular, in this figure, an exemplary layout for the transistors (i.e. p0, n0, p1, n1, p2, n2, p3, n3, p4, n4) of FIG. 1 on a system-on-a chip (SoC) 300 is shown. However, it should be noted that, in other embodiments, various different layouts for the transistors on a SoC 300 may be employed for the logic device 100 of FIG. 1.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for mitigating errors caused by transients in a logic gate transistor, the method comprising:

biasing, by a first stage of transistors, a second stage of transistors such that a voltage potential across terminals of each of the transistors of the second stage are at an equal voltage potential; and biasing, by the second stage of transistors, the logic gate transistor such that a Voltage potential across terminals of the logic gate transistor are at an equal voltage potential, thereby ensuring that the transients will not cause the logic gate transistor to erroneously change logic states when the logic gate transistor is in a logically off state.

2. The method of claim 1, wherein the transients are due to one of a radiation event, a noise event, or crosstalk.

3. The method of claim 1, wherein the logic gate transistor is a field-effect transistor (FET).

4. The method of claim 3, wherein the FET is one of a metal-oxide-semiconductor field-effect transistor (MOSFET) or a junction field-effect transistor (JFET).

5. The method of claim 1, wherein the logic gate transistor is one of a p-type transistor or an n-type transistor.

6. The method of claim 1, wherein the terminals of the logic gate transistor are a source terminal and a drain terminal.

7. The method of claim 1, wherein the transistors of the first stage of transistors comprise a p-type transistor and an n-type transistor.

8. The method of claim 1, wherein the transistors of the second stage of transistors comprise a p-type transistor and an n-type transistor.

9. The method of claim 1, wherein a system-on-a chip (SoC) device comprises the logic gate transistor, the first stage of transistors, and the second stage of transistors.

10. The method of claim 1, wherein a logic device comprises the logic gate transistor.

11. The method of claim 10, wherein the logic device is one of an inverter, an OR gate, a NOR gate, an AND gate, a NAND gate, a NOT gate, a XOR gate, or a XNOR gate.

12. A system for mitigating errors caused by transients in a logic gate transistor, the system comprising:

the logic gate transistor;

a first stage of transistors to bias a second stage of transistors such that a voltage potential across terminals of each of the transistors of the second stage are at an equal voltage potential; and the second stage of transistors to bias the logic gate transistor such that a voltage potential across terminals of the logic gate transistor are at an equal voltage potential, thereby ensuring that the transients will not cause the logic gate transistor to erroneously change logic states when the logic gate transistor is in a logically off state.

13. The system of claim 12, wherein the transients are due to one of a radiation event, a noise event, or crosstalk.

14. The system of claim 12, wherein the logic gate transistor is a field-effect transistor (FET).

15. The system of claim 14, wherein the FET is one of a metal-oxide-semiconductor field-effect transistor (MOSFET) or a junction field-effect transistor (JFET).

16. The system of claim 12, wherein the logic gate transistor is one of a p-type transistor or an n-type transistor.

17. The system of claim 12, wherein the terminals of the logic gate transistor are a source terminal and a drain terminal.

18. The system of claim 12, wherein the system is a system-on-a-chip (SoC) device.

19. The system of claim 12, wherein a logic device comprises the system.

20. The system of claim 19, wherein the logic device is one of an inverter, an OR gate, a NOR gate, an AND gate, a NAND gate, a NOT gate, a XOR gate, or a XNOR gate.

* * * * *